(12) United States Patent
Wirz et al.

(10) Patent No.: US 11,189,609 B2
(45) Date of Patent: Nov. 30, 2021

(54) METHODS FOR REDUCING HEAT TRANSFER IN SEMICONDUCTOR ASSEMBLIES, AND ASSOCIATED SYSTEMS AND DEVICES

(71) Applicant: Micron Technology, Inc., Boise, ID (US)

(72) Inventors: Brandon P. Wirz, Boise, ID (US); Andrew M. Bayless, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/864,873

(22) Filed: May 1, 2020

(65) Prior Publication Data

US 2021/0343692 A1   Nov. 4, 2021

(51) Int. Cl.
| | |
|---|---|
| *H01L 25/00* | (2006.01) |
| *H01L 21/56* | (2006.01) |
| *H01L 23/00* | (2006.01) |
| *H01L 25/065* | (2006.01) |

(52) U.S. Cl.
CPC ............ *H01L 25/50* (2013.01); *H01L 21/561* (2013.01); *H01L 24/29* (2013.01); *H01L 24/83* (2013.01); *H01L 25/0657* (2013.01); *H01L 2224/83203* (2013.01)

(58) Field of Classification Search
CPC ......... H01L 24/29; H01L 24/97; H01L 25/50; H01L 24/83; H01L 25/0657; H01L 21/561; H01L 2224/83203; H01L 2224/85203; H01L 2224/48145; H01L 2224/83

See application file for complete search history.

(56) References Cited

U.S. PATENT DOCUMENTS

| | | | | |
|---|---|---|---|---|
| 10,312,226 | B2 * | 6/2019 | Ma | .................. H01L 23/3107 |
| 2012/0088332 | A1 * | 4/2012 | Lee | .................. H01L 23/3121 |
| | | | | 438/113 |
| 2015/0262878 | A1 * | 9/2015 | Sato | .................. H01L 23/3135 |
| | | | | 257/777 |
| 2019/0252362 | A1 | 8/2019 | Ma et al. | |

* cited by examiner

*Primary Examiner* — Jasmine J Clark
(74) *Attorney, Agent, or Firm* — Perkins Coie LLP

(57) ABSTRACT

Methods for reducing heat transfer in semiconductor devices, and associated systems and devices, are described herein. In some embodiments, a method of manufacturing a semiconductor device includes forming a channel in a region of a substrate between a first die stack and a second die stack. The first die stack includes a plurality of first dies attached to each other by first film layers and the second die stack includes a plurality of second dies attached to each other by second film layers. The channel extends entirely through a thickness of the substrate. The method also includes applying heat to the first die stack to cure the first film layers. The channel reduces heat transfer from the first die stack to the second die stack.

20 Claims, 9 Drawing Sheets

METHODS FOR REDUCING HEAT TRANSFER IN SEMICONDUCTOR ASSEMBLIES, AND ASSOCIATED SYSTEMS AND DEVICES

TECHNICAL FIELD

The present technology generally relates to semiconductor devices, and more particularly relates to methods for reducing heat transfer during manufacturing of semiconductor devices.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (the package's "footprint") is to vertically stack multiple semiconductor dies on top of one another in a single package. The dies in such vertically stacked packages can be interconnected by electrically coupling the bond pads of the individual dies with the bond pads of adjacent dies using through-silicon vias (TSVs).

During a chip-to-wafer (C2W) or chip-to-substrate (C2S) stacking process, multiple die stacks are assembled on the wafer or substrate, then heat is applied to individual or multiple die stacks to bond the layered dies within each stack to each other (e.g., via thermocompression bonding (TCB)). In this process, heat may be transferred to neighboring die stacks that have not yet been bonded. This heat transfer may cause premature heating of die stack components that impairs subsequent bond formation in the neighboring die stacks.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

In several of the embodiments described below, a semiconductor assembly includes a plurality of die stacks (e.g., a first die stack and a second die stack) coupled to a substrate (e.g., a semiconductor wafer). The substrate can include one or more channels between at least some of the die stacks. The channel(s) can be configured to reduce or prevent heat transfer between the die stacks, e.g., during collective bonding, gang bonding, or other TCB process. The embodiments herein can improve the yield, reliability, and throughput of processes for manufacturing three-dimensional semiconductor devices.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-8. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1A:
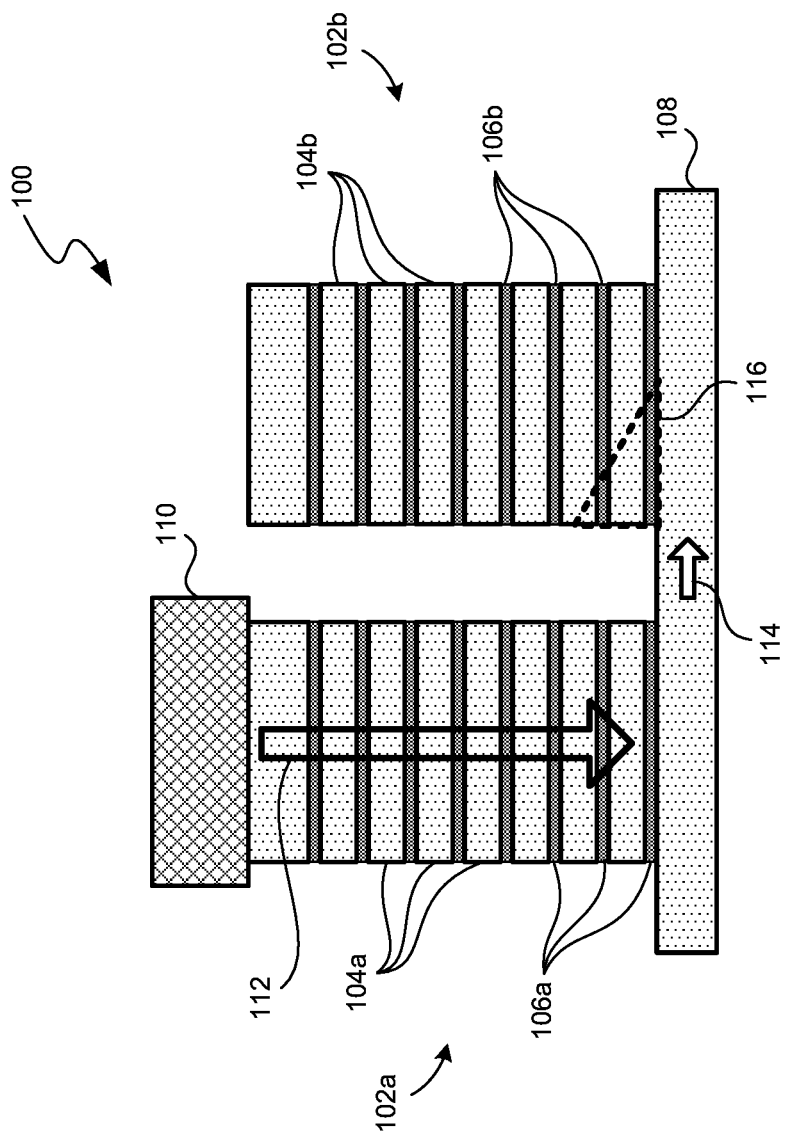
FIG. 1A is a side cross-sectional view of a semiconductor assembly undergoing a collective bonding process.

FIG. 1A is a side cross-sectional view of a semiconductor assembly 100 undergoing collective bonding, e.g., as part of a C2W or C2S stacking process. The assembly 100 includes a first stack of semiconductor dies ("first die stack 102a") and a second stack of semiconductor dies ("second die stack 102b") arranged on a substrate 108 (e.g., a semiconductor wafer or package substrate). The first die stack 102a can include a plurality of first semiconductor dies 104a and the second die stack 102b can include a plurality of second semiconductor dies 104b. The first and second die stacks 102a-b can each include a plurality of non-conductive film (NCF) layers (e.g., first NCF layers 106a and second NCF layers 106b) between individual semiconductor dies, and also between the bottommost semiconductor die and the substrate 108. Each die stack can also include interconnect structures (e.g., solder bumps and metallic pillars—not shown) for electrically coupling the semiconductor dies to each other and to the substrate 108. Before the collective bonding process has been performed, the solder in the interconnect structures is in a pre-melted state and the NCF layers are in an uncured state. As a result, the first and second die stacks 102a-b can be held together primarily by the tackiness of the uncured NCF layers, rather than by the interconnect structures (e.g., quick tacking).

During the collective bonding process, heat and pressure applied to the first die stack 102a melts and reflows the solder within the first die stack 102a to electrically couple the first semiconductor dies 104a to each other and to the substrate 108, in accordance with TCB techniques known to those of skill in the art. The heat can also cure and/or harden the first NCF layers 106a within the first die stack 102a to mechanically couple the first semiconductor dies 104a to each other and to the substrate 108. In some embodiments, the heat and pressure are applied via a bond tip 110 pressing against the uppermost semiconductor die of the first die stack 102a. The heat propagates downward through the first die stack 102a (e.g., along direction 112) from the uppermost semiconductor die to the lowest semiconductor die and the substrate 108. The temperature of the bond tip 110 is accordingly high enough to heat the entire first die stack 102a to a temperature sufficient for bonding and/or curing to occur.

In operation, heat often transfers from the first die stack 102a laterally through the substrate 108 (e.g., along direction 114) and into one or more portions of the second die stack 102b creating a heat-affected zone (HAZ) 116. Lateral heat transfer can occur, for example, when the thermal conductivity of the substrate 108 is sufficiently high and/or if a sufficiently large amount of heating is applied to the first die stack 102a. The HAZ 116 can include at least some of the second semiconductor dies 104b and/or the second NCF layers 106b (e.g., the semiconductor dies and/or NCF layers closest to the substrate 108). As a result, the temperature of portions of the second die stack 102b can increase even though the bond tip 110 is not directly applying heat to the second die stack 102b. If the temperature in the second die stack 102b becomes sufficiently high, one or more portions of the second NCF layers 106b within the HAZ 116 can become partially or completely cured. The premature curing of the second NCF layers 106b can impair subsequent bonding of the second semiconductor dies 104b of the second die stack 102b to each other and/or to the substrate 108. For example, cured portions of the second NCF layers 106 in the HAZ 116 can become harder and/or stiffer, thus preventing the interconnect structures of the second die stack 102b from properly contacting and/or bonding during a subsequent TCB operation performed on the second die stack 102b (e.g., via bond tip 110). As a result, some of the electrical and/or mechanical couplings between the second semiconductor dies 104b and/or the substrate 108 can be open, incomplete, or otherwise incorrectly formed, thus resulting in yield loss and reducing the reliability of the manufacturing process.

Figure 1B:
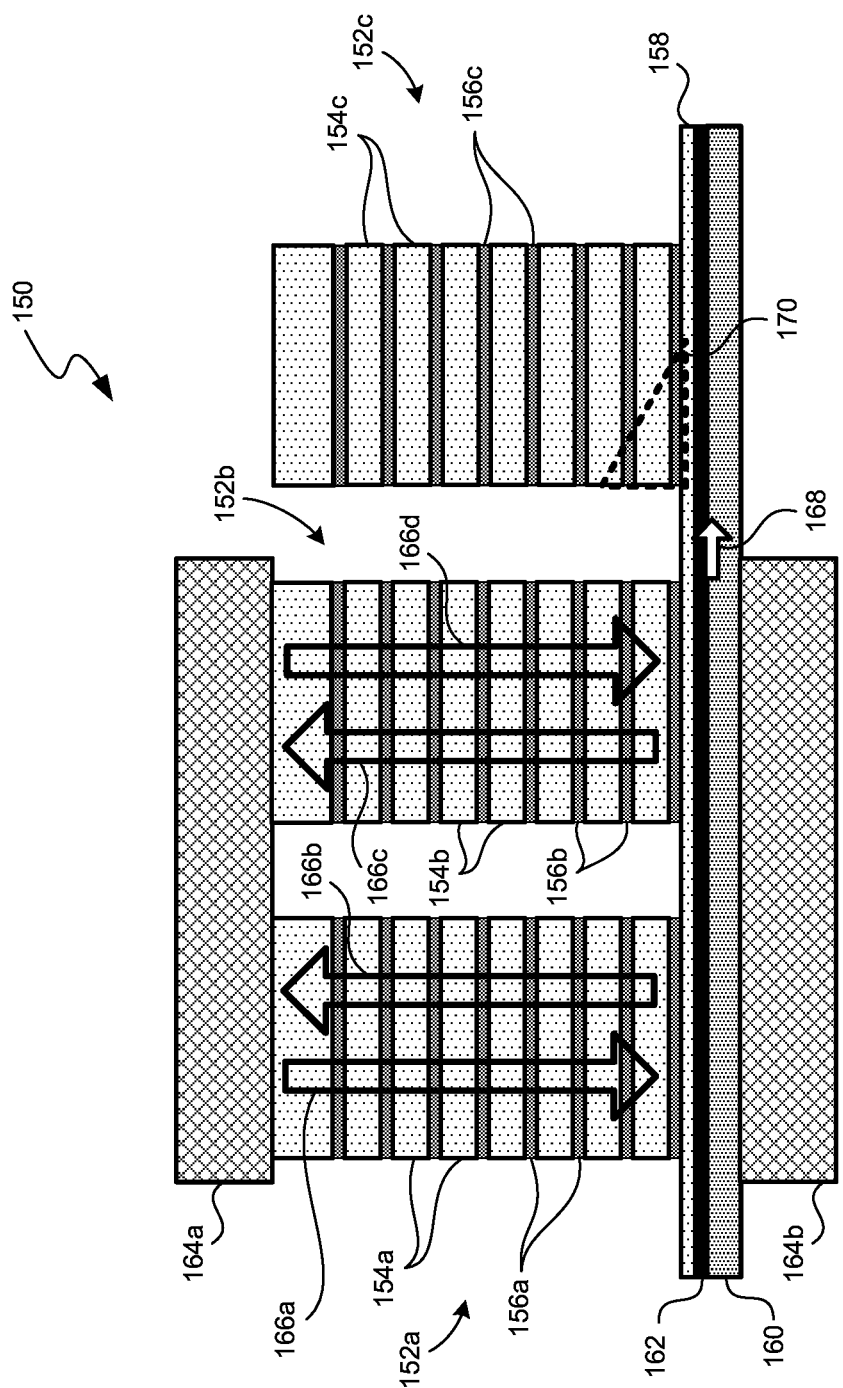
FIG. 1B is a side cross-sectional view of a semiconductor assembly undergoing a gang bonding process.

FIG. 1B is a side cross-sectional view of a semiconductor assembly 150 undergoing gang bonding, e.g., as part of a C2W or C2S stacking process. Similar to the assembly 150 of FIG. 1A, the assembly 150 includes a first die stack 152a, a second die stack 152b, and a third die stack 152c on a substrate 158. The first die stack 152a includes a plurality of first semiconductor dies 154a and a plurality of first NCF layers 156a, the second die stack 152b includes a plurality of second semiconductor dies 154b and plurality of second NCF layers 156b, and the third die stack 152c includes a plurality of third semiconductor dies 154c and a plurality of third NCF layers 156c. Each die stack 152a-c can also include interconnect structures (e.g., solder bumps and metallic pillars—not shown) for electrically coupling the semiconductor dies to each other and to the substrate 158. The first, second, and third die stacks 152a-c can be initially assembled on the substrate 158 by quick tacking, such that the electrical interconnections between the semiconductor dies 154a-c have not yet been formed. The substrate 158 can be coupled to a carrier 160 via an adhesive layer 162.

During the gang bonding process, heat and pressure can be applied to the first and second die stacks 152a-b to couple their respective semiconductor dies to each other and to the substrate 158 via a TCB operation, as previously described. The heat and pressure can be applied via a first bond tip 164a and a second bond tip 164b. The first bond tip 164a can engage the uppermost semiconductor dies in the first and second die stacks 152a-b, and the second bond tip 164b can engage the carrier 160. As a result, heat transfers through the first and second die stacks 152a-b (e.g., along directions 166a-d). As the first and second bond tips 164a-b apply pressure, they compress the first and second die stacks 152a-b from opposing directions to facilitate bonding.

During operation, heat often transfers from the first and/or second die stacks 152a-b laterally through the substrate 158, carrier 160, and/or adhesive layer 162 (e.g., along direction 168) and into one or more portions of the third die stack 152c creating a heat-affected zone (HAZ) 170. Similar to the discussion with respect to FIG. 1A, heating the third die stack 152c can prematurely cure at least some of the third NCF layers 156c, which inhibits or otherwise detrimentally affects formation of mechanical and/or electrical interconnects between the third semiconductor dies 154c and/or the substrate 158 during a subsequent TCB operation performed on the third die stack 152c. As a result, some of the electrical and/or mechanical couplings between the third semiconductor dies 154c and/or the substrate 158 can be open, incomplete, or otherwise incorrectly formed, thus resulting in yield loss and reducing the reliability of the manufacturing process.

The present technology provides various methods for reducing undesired heat transfer between semiconductor die stacks during the manufacturing process, e.g., during a TCB operation performed as part of a C2W or C2S stacking process as described with respect to FIGS. 1A and 1B. The methods herein can include modifying the substrate of a semiconductor assembly to reduce or inhibit heat transfer therethrough. For example, one or more portions of the substrate can be thinned, cut, or otherwise removed to reduce or eliminate heat transfer pathways through the substrate. In some embodiments, the substrate modifications described herein reduce the amount of heat transferred to neighboring (e.g., adjacent) die stacks by at least 10%, 20%, 30%, 40%, 50%, 60%, 70%, 80%, 90%, 95%, 99%, or 100% compared to an unmodified substrate. As a result, the present technology is expected to reduce or prevent unwanted heating of neighboring semiconductor die stacks so that the film layers in these die stacks remain substantially or completely uncured (e.g., the curing that occurs, if any, is not expected to detrimentally affect interconnect formation in the neighboring die stacks in subsequent TCB processes), thereby improving yield, reliability, and throughput.

Figures 2A, 2B:
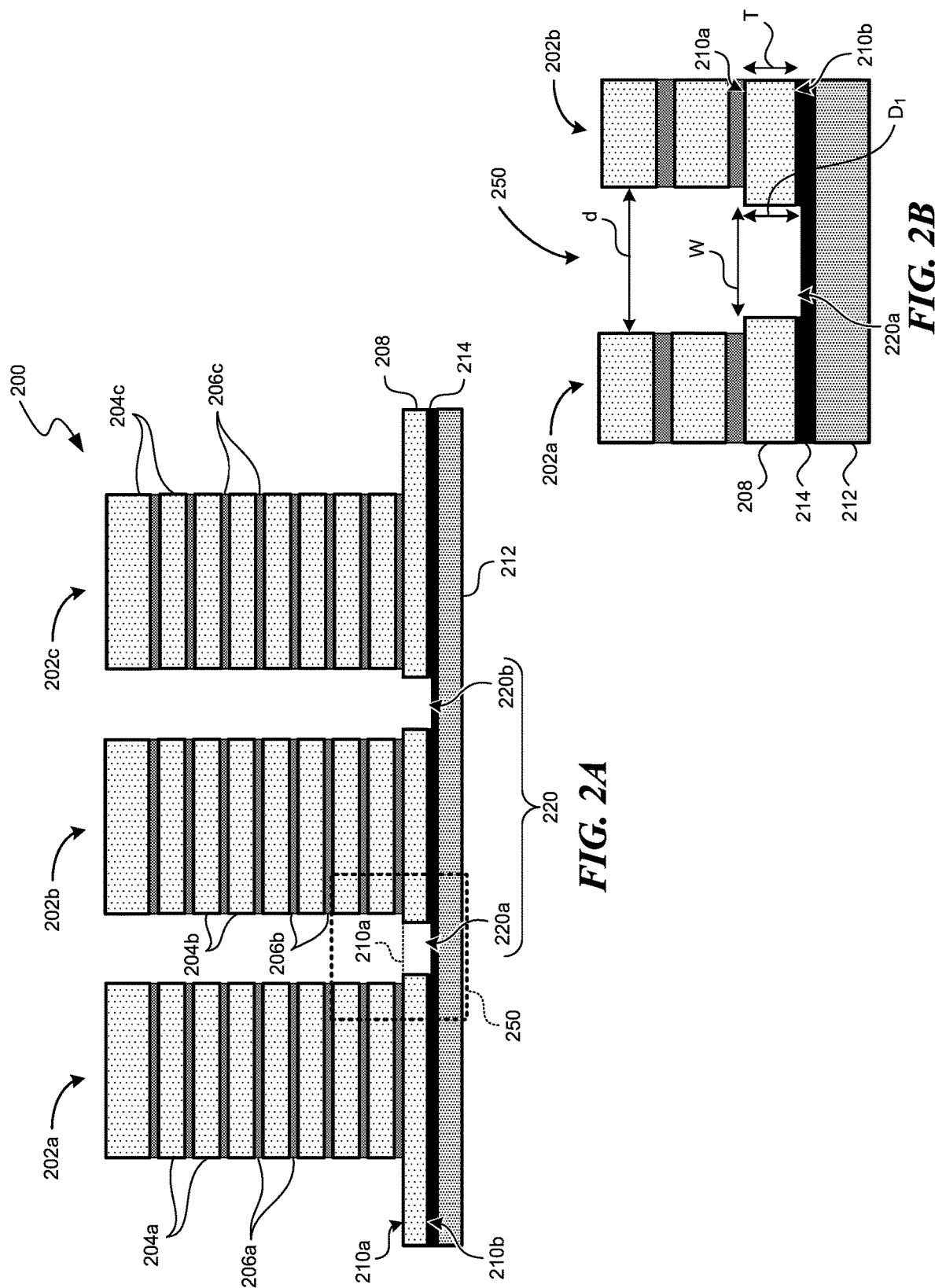
FIGS. 2A and 2B illustrate a semiconductor assembly configured in accordance with embodiments of the present technology.

FIGS. 2A and 2B illustrate a semiconductor assembly 200 configured in accordance with embodiments of the present technology. More specifically, FIG. 2A is a side cross-sectional view of the assembly 200 and FIG. 2B is a closeup side cross-sectional view of a portion 250 of the assembly 200. The assembly 200 includes a plurality of semiconductor die stacks 202 (e.g., first die stack 202a, second die stack 202b, and third die stack 202c) on a substrate 208. Each of the die stacks 202a-c includes a respective plurality of vertically arranged semiconductor dies (e.g., first semiconductor dies 204a, second semiconductor dies 204b, and third semiconductor dies 204c). For example, in the illustrated embodiment, each die stack includes eight semiconductor dies. In other embodiments, the assembly 200 can include fewer or more die stacks (e.g., one, two, four, five, six, seven, eight, nine, tens, hundreds, thousands, or more die stacks), and each die stack can include fewer or more semiconductor dies (e.g., one, two, three, four, five, six, seven, nine, ten, or more dies).

The semiconductor dies 204a-c can each include a semiconductor substrate (e.g., a silicon substrate, a gallium arsenide substrate, an organic laminate substrate, etc.). In some embodiments, one or more of the semiconductor dies 204a-c include various types of semiconductor components and functional features, such as memory circuits (e.g., dynamic random-access memory (DRAM), static random-access memory (SRAM), flash memory, or other type of memory circuits), controller circuits (e.g., DRAM controller circuits), logic circuits, processing circuits, circuit elements (e.g., wires, traces, interconnects, transistors, etc.), imaging components, and/or other semiconductor features Alternatively or in combination, one or more of the semiconductor dies 204a-c can be a "blank" substrate that does not include integrated circuit components and that is formed from, for example, crystalline, semi-crystalline, and/or ceramic substrate materials, such as silicon, polysilicon, aluminum oxide ($Al_2O_3$), sapphire, and/or other suitable materials. Optionally, one or more of the semiconductor dies 204a-c can include an insulating material, such as a suitable dielectric material (e.g., a passivation material, a polyimide material, and/or other materials used to cover a surface of a semiconductor device).

In some embodiments, each of the die stacks 202a-c includes a respective plurality of interconnect structures (e.g., bumps, micro-bumps, pillars, columns, studs, etc., not shown) for mechanically, electrically, and/or thermally connecting the respective semiconductor dies to each other and/or to the substrate 208. The interconnect structures can be located between individual semiconductor dies and/or between a semiconductor die and the substrate 208. Each interconnect structure can be formed of any suitably conductive material such as copper, nickel, gold, silicon, tungsten, solder (e.g., SnAg-based solder), conductive-epoxy, combinations thereof, etc., and can be formed by electroplating, electroless-plating, or another suitable process. In some embodiments, the interconnect structures can also include barrier materials (e.g., nickel, nickel-based intermetallic, and/or gold) formed over end portions of the interconnect structures. The barrier materials can facilitate bonding and/or prevent or at least inhibit the electromigration of copper or other metals used to form the interconnect structures. The interconnect structures can be configured to connect the semiconductor dies of each die stack to each other and/or to the substrate 208.

The first, second, and third die stacks 202a-c can each include a respective plurality of film layers (e.g., first film layers 206a, second film layers 206b, and third film layers 206c). The film layers 206a-c can be positioned between individual semiconductor dies and/or between a lowermost semiconductor die in the stack and the substrate 208. Each film layer 206a-c can be or include an NCF or a die attach film. In some embodiments, the film layers 206a-c can include any material suitable for filling spaces between the semiconductor dies, such as a film, underfill, resin, matrix, paste, etc. Optionally, the film layers 206a-c can be made of an underfill material, such as a nonconductive epoxy paste (e.g., XS8448-171 manufactured by Namics Corporation of Niigata, Japan), a capillary underfill, and/or other suitable electrically insulative materials. The underfill material can alternatively be a dielectric underfill, such as FP4585 manufactured by Henkel of Dusseldorf, Germany. Each film layer can be a generally continuous sheet of material, or can include holes or other patterning (e.g., to accommodate the interconnect structures).

The substrate 208 can be any component suitable for supporting the die stacks 202a-c. In some embodiments, the substrate 208 is a semiconductor wafer (e.g., an active wafer with semiconductor components formed therein). In other embodiments, the substrate 208 is a package substrate, such as a redistribution structure, an interposer, a printed circuit board, a dielectric spacer, another semiconductor die (e.g., a logic die), or another suitable substrate. The substrate 208 can include semiconductor components (e.g., doped silicon wafers or gallium arsenide wafers), nonconductive components (e.g., various ceramic substrates, such as aluminum oxide (Al2O3), etc.), aluminum nitride, and/or conductive portions (e.g., interconnecting circuitry, TSVs, etc.).

In some embodiments, the substrate 208 includes an upper surface 210a and a lower surface 210b. The upper surface 210a can be an active surface at the region where functional components such as integrated circuitry, metallization structures, redistribution structures, etc., are located. The first, second, and third die stacks 202a-c can be coupled to the upper surface 210a of the substrate 208 (e.g., via an NCF layer and/or interconnect structures). In some embodiments, the die stacks 202a-c are electrically coupled to functional components on the upper surface of the substrate 208. The lower surface 210b of the substrate 208 can be coupled to a carrier 212 configured to temporarily provide mechanical support to the assembly 200 for subsequent manufacturing and/or processing stages (e.g., for TCB operations, encapsulating, thinning, etc.). The carrier 212 can be a wafer or other structure made from silicon, glass, ceramic, or other suitable materials. Optionally, the carrier 212 can be made from a material that has a relatively low thermal conductivity (e.g., compared to the substrate 208).

In some embodiments, the lower surface 210b of the substrate 208 is temporarily coupled to the carrier 212 via an adhesive or release layer 214. The adhesive layer 214 can be selectively dissolved, debonded, or otherwise separated from the substrate 208 upon application of a suitable energy (e.g., heat, light) or agent (e.g., a solvent, an acid, water). The adhesive layer 214 can be made of ay suitable material, such as an adhesive (e.g., a thermosetting adhesive), a polymer, an epoxy, a film, a tape, a paste, etc. In some embodiments, the adhesive layer 214 is made of an insulating material having a relatively low thermal conductivity (e.g., compared to the substrate 208). The adhesive layer 214 can optionally be a thermosetting material having a relatively high stiffness and/or glass transition temperature.

To reduce lateral heat transfer between the first, second, and third die stacks 202a-c during a collective bonding process, a gang bonding process, or other TCB operation, the substrate 208 can include one or more channels 220 formed therein. The channels 220 can be grooves, notches, trenches, cavities, or any other structure extending from the upper surface 210a of the substrate 208 towards the lower surface 210b. As shown in FIG. 2A, the channels 220 can extend completely through the thickness of the substrate from the upper surface 210a to the lower surface 210b. The channels 220 can be formed using any method suitable for removing material from the substrate 208, such as by cutting or dicing (e.g., using a blade or saw, a laser, etc.), grinding, etching, etc. In embodiments where the channels 220 are formed using a blade, the width of the blade can be less than the width of a dicing blade used in a subsequent singulation step, as described in further detail below.

In some embodiments, the channels 220 are formed before assembling any of the die stacks 202a-c on the substrate 208 (e.g., before quick tacking any semiconductor dies to the substrate 208). The channels 220 can optionally be formed in the substrate 208 before any functional components (e.g., integrated circuitry, metallization structures, redistribution structures, etc.) are formed on and/or coupled to the substrate 208. Alternatively, the channels 220 can be formed after functional components are formed on and/or coupled to the substrate 208, but before any components of the die stacks 202a-c are coupled to the substrate 208. In other embodiments, the channels are formed after forming the die stacks 202a-c or portions thereof (e.g., after quick tacking one or more layers of semiconductor dies to the substrate 208), but before any TCB or other bonding operations have been performed to form electrical interconnections between the die stacks 202a-c and/or the substrate 208.

In some embodiments, the die stacks 202a-c on the substrate 208 are spaced apart from each other and the channels 220 are formed in regions of the substrate 208 between adjacent die stacks (e.g., the "streets" or "dicing lanes" of the assembly 200). For example, in the illustrated embodiment, the substrate 208 includes a first channel 220a between the first and second die stacks 202a-b, and a second channel 220b between the second and third die stacks 202b-c). Although FIG. 2A illustrates the first and second channels 220a-b as being separate structures, in other embodiments the first and second channels 220a-b can connected by cross-channel or other structures so as to form a single continuous channel (e.g., a grid). It will be appreciated that the substrate 208 can include one or more discrete channels that are separated from each other, one or more continuous channels, or any suitable combination thereof. In some embodiments, the substrate 208 includes tens, hundreds, or thousands of channels. Additionally, some portions of the substrate 208 can lack any channels. For example, channels may not be formed between die stacks that are intended to be bonded at the same time, such as between first die stack 202a and the second die stack 202b (shown in phantom by upper surface 210a in dashed line between die stacks 202a-b). Channels can also be omitted from locations where little or no lateral heat transfer is expected and/or where lateral heat transfer is not expected to detrimentally affect manufacturing (e.g., the edges of the substrate).

As best seen in FIG. 2B, each channel 220 (e.g., first channel 220a) can extend through the substrate 208 from the upper surface 210a towards the lower surface 210b to a depth $D_1$. The depth $D_1$ can be at least 5 µm, 10 µm, 15 µm, 20 µm, 25 µm, 30 µm, 40 µm, 50 µm, 60 µm, 70 µm, 80 µm, 90 µm, or 100 µm. In the illustrated embodiment, the depth $D_1$ of the channel 220 is greater than or equal to the thickness T of the substrate 208, such that the channel 220 extends through the entire thickness T of the substrate 208, and optionally at least partially into the adhesive layer 214 and/or the carrier 212. For example, the minimum depth $D_1$ of the channel 220 can be at least 50%, 75%, 95%, 99%, 100%, 105%, 110%, 120%, 130%, 140%, or 150% of the thickness T of the substrate 208. The channel 220 can extend past the lower surface 210b of the substrate 208 (e.g., into the adhesive layer 214 and/or the carrier 212) by at least 5 µm, 10 µm, 15 µm, 20 µm, 25 µm, 30 µm, 40 µm, or 50 µm. As a result, the channels 220 can separate the substrate 208 into a plurality of discrete segments that are held together by the adhesive layer 214. In such embodiments, the adhesive layer 214 can be configured to have sufficient stiffness to reduce or prevent the substrate segments and die stacks 202a-c from moving relative to each other.

The width W of each channel 220 can also be varied to enhance the thermal isolation between the second die stack 202b and the third die stack 202c. In some embodiments, the width W is at least 10 µm, 20 µm, 30 µm, 40 µm, 50 µm, 60 µm, 70 µm, 80 µm, 90 µm, 100 µm, 150 µm, 200 µm, 250 µm, 300 µm, 400 µm, or 500 µm. Alternatively or in combination, the width W can be no more than 500 µm, 400 µm, 300 µm, 250 µm, 200 µm, 150 µm, 100 µm, 90 µm, 80 µm, 70 µm, 60 µm, 50 µm, 40 µm, 30 µm, 20 µm, or 10 µm. In some embodiments, the width W of each channel 220 is less than or equal to the distance d between neighboring die stacks (e.g., the distance between the edges of the first and second die stacks 202a-b). For example, the width W can be no more than 95%, 90%, 80%, 70%, 60%, 50%, 40%, 30%, 20%, or 10% of the distance d.

The geometry of the channel 220 can be configured in many different ways. In the illustrated embodiment, the channel 220 has a rectangular cross-sectional shape. In other embodiments, the channel 220 can have a different cross-sectional shape, such as a square, triangular, polygonal, rounded, or curved shape, or any other suitable shape. Although in the illustrated embodiment the width W of the channel 220 is generally constant, in other embodiments, the width W can be variable. For example, the channel 220 can have wider upper portions and narrower lower portions, wider lower portions and narrower upper portions, etc. As such, any description herein regarding the width W of the channel 220 can refer to the maximum, minimum, or average width of the channel 220. Additionally, different channels 220 within the substrate 200 can have different geometries (e.g., different widths, depths, shapes, etc.) and/or an individual channel can have different portions with different geometries.

After the channels 220 have been formed and the die stacks 202a-c have been assembled on the substrate 208 (e.g., by quick tacking), heat can be applied to the die stacks 202a-c to electrically couple the dies within each die stack to each other and to the substrate 208 (e.g., via the interconnect structures between individual semiconductor dies). The heat can be applied to all of the die stacks 202a-c concurrently, or the heat can be applied sequentially to different die stacks (e.g., the first die stack 202a is heated before the second die stack 202b, which is heated before the third die stack 202c). Optionally, heat can be applied to multiple die stacks concurrently (e.g., to both the first and second die stacks 202a-b). The presence of the channels 220 can reduce or inhibit heat transfer through the substrate 208 to neighboring (e.g., adjacent) die stacks that are not intended to be heated at the same time. In some embodiments, the carrier 212 and/or the adhesive layer 214 have a relatively low thermal conductivity compared to the substrate 208 such that little or no heat transfer is expected to occur through these components. As a result, the neighboring die stacks can exhibit little or no increase in temperature. For example, the increase in temperature of the neighboring die stacks can be less than 50%, 40%, 30%, 20%, 10%, 5%, or 1% of the increase in temperature of the die stack(s) which are being directly heated.

Accordingly, heat can be applied to one or more die stacks (e.g., by a bond tip applied to the uppermost semiconductor die of the die stack(s) and/or a bond tip applied to the carrier 212) to form electrical interconnections and cure the film layers within the die stack(s), but without substantially curing any of the film layers in neighboring die stacks. In some embodiments, the geometry of the channels 220 (e.g., depth $D_1$ and/or width W) is configured so that when heat is applied to a die stack (e.g., the first die stack 202a) during a TCB process, heat transfer to neighboring die stacks (e.g., the second die stack 202b and/or third die stack 202c) is reduced or inhibited so that there are no heat-affected zones in the neighboring die stacks. As a result, some or all of the film layers in the neighboring die stacks (e.g., second film layers 206b and/or third film layers 206c) can remain substantially or completely uncured even while the film layers in the die stack undergoing the TCB process (e.g., first film layers 206a) are cured. For example, the film layer between the lowermost semiconductor die in the neighboring die stack and the substrate 208, which is expected to be the most affected by lateral heat transfer, can remain substantially or completely uncured. In some embodiments, the channels 220 are expected to allow for higher throughput bonding processes, e.g., the temperature of the bond tip(s) can be increased due to the reduction in lateral heat transfer, fewer passes of quick tacking and bonding are needed, etc.

Figures 3A, 3B:
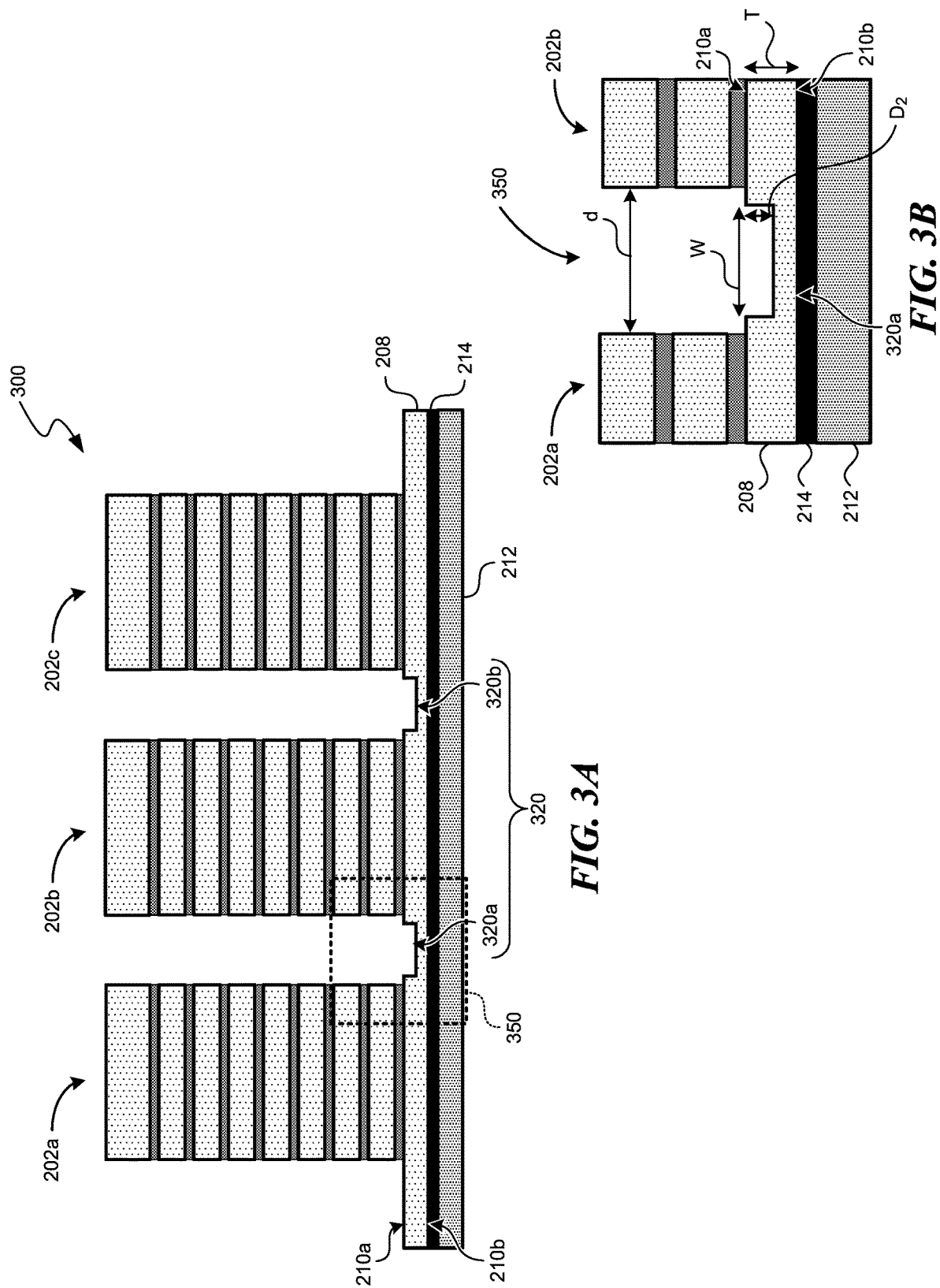
FIGS. 3A and 3B illustrate a semiconductor assembly with channels that extend to an intermediate depth configured in accordance with embodiments of the present technology.

FIGS. 3A and 3B illustrate a semiconductor assembly 300 with channels 320 that extend to an intermediate depth configured in accordance with embodiments of the present technology. More specifically, FIG. 3A is a side cross-sectional view of the assembly 300 and FIG. 3B is a closeup side cross-sectional view of a portion 350 of the assembly 300. The features of the assembly 300 shown in FIGS. 3A and 3B are generally similar or identical to the assembly 200 described with respect to FIGS. 2A and 2B. Accordingly, the discussion of FIGS. 3A and 3B will be limited to those features that differ from the embodiments of FIGS. 2A and 2B.

As shown in FIGS. 3A and 3B, the assembly 300 includes a plurality of semiconductor die stacks (e.g., first die stack 202a, second die stack 202b, and third die stack 202c) coupled to a substrate 208. The substrate 208 includes one or more channels 320 formed in regions between adjacent die stacks (e.g., a first channel 320a between the first and second die stacks 202a-b and/or a second channel 320b between the second and third die stacks 202b-c). Although FIG. 3A illustrates the first and second channels 320a-b as being separate structures, in other embodiments the first and second channels 320a-b can connect to each other so as to form a single continuous channel (e.g., a grid). As best seen in FIG. 3B, each channel 320 (e.g., first partial channel 320a) can extend through the substrate 208 from the upper surface 210a towards the lower surface 210b to a depth $D_2$. In the illustrated embodiment, the depth $D_2$ of the channel 320 is an intermediate depth less than the thickness T of the substrate 208, such that the channel 320 does not extend to the lower surface 210b or into the adhesive layer 214. For example, the depth $D_2$ of the channel 320 can be less than 100% of the thickness T of the substrate 208, e.g., no more than 95%, 90%, 80%, 70%, 60%, 50%, 40%, 30%, 20%, or 10% of the thickness T. In some embodiments, the channel 320 extends past the upper surface 210a of the substrate 208 by no more than 5 µm, 10 µm, 15 µm, 20 µm, 25 µm, 30 µm, 40 µm, or 50 µm. Alternatively or in combination, the channel 320 can terminate at least 5 µm, 10 µm, 15 µm, 20 µm, 25 µm, 30 µm, 40 µm, or 50 µm away from the lower surface 210b of the substrate 208. The configuration of the channel 320 can improve mechanical stability of the die stacks, e.g., in embodiments where the adhesive layer 214 is relatively compliant and may allow the die stacks 202a-c to move relative to each other if the substrate 208 is separated into discrete sections. However, the depth $D_2$ of the channel is still sufficiently deep to reduce or inhibit heat transfer to neighboring die stacks during a TCB operation. In some embodiments, the minimum depth $D_2$ of the channel 320 is greater than or equal to 50%, 60%, 75%, 80%, 85%, 90%, 95%, or 99% of the thickness T of the substrate 208.

The embodiments described with respect to FIGS. 2A-3B can be combined in many different ways. For example, a semiconductor assembly can include some channels that extend entirely through the substrate and some channels that extend only partially through the substrate. Optionally, a single channel can include some portions that extend entirely through the substrate and some channels that extend partially through the substrate.

FIGS. 4-7C illustrate additional stages for manufacturing a semiconductor assembly 200. Although FIGS. 4-7C show an assembly 200 with channels 220 that extend entirely through the substrate (e.g., as previously described with respect to FIGS. 2A and 2B), it will be appreciated that the embodiments described herein are also applicable to manufacturing of an assembly with channels that extend only partially through the substrate (e.g., channels 320 as described with respect to FIGS. 3A and 3B). The manufacturing stages illustrated in FIGS. 4-7C can be performed after the die stacks 202a-c have been bonded (e.g., via a TCB operation as previously described).

Figure 4:
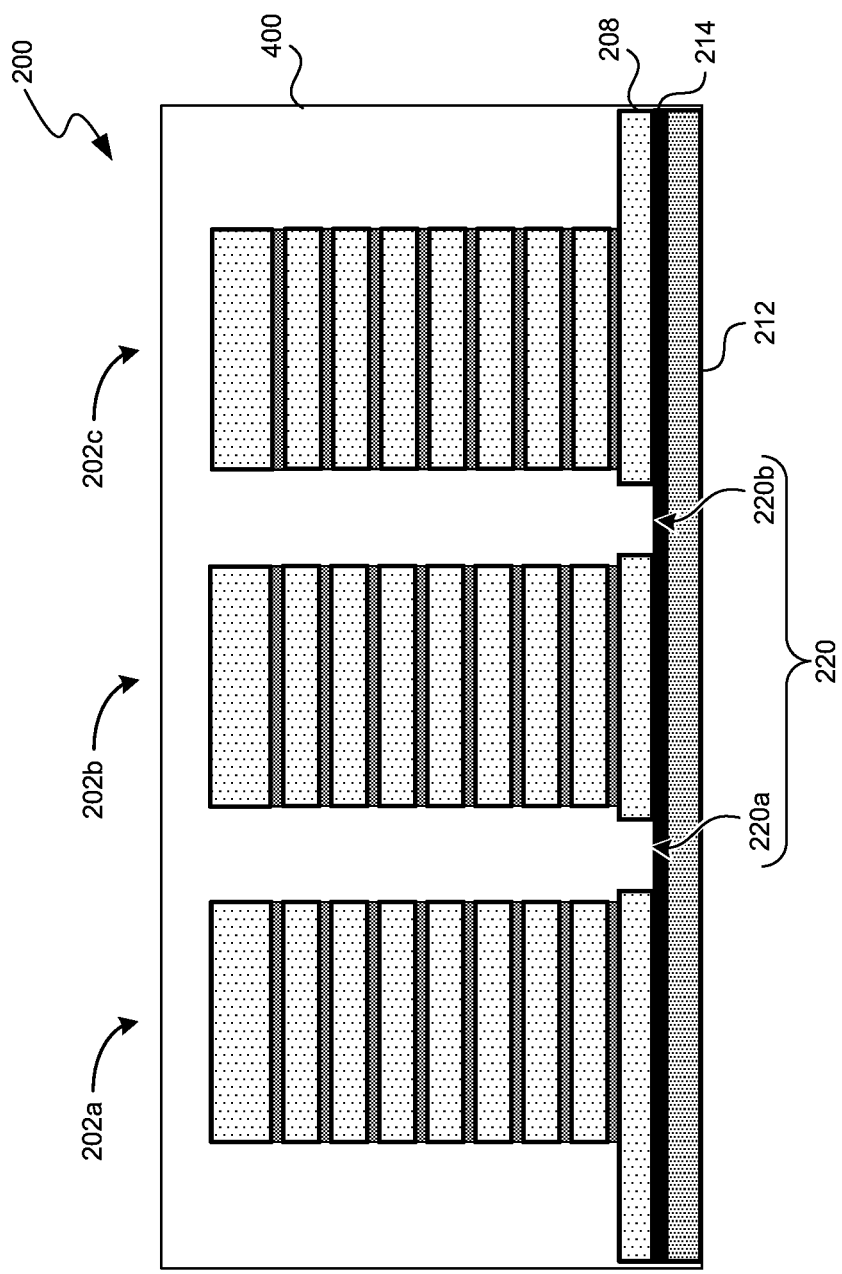
FIG. 4 illustrates encapsulation of the assembly of FIG. 2A in a mold material configured in accordance with embodiments of the present technology.

FIG. 4 illustrates encapsulation of the assembly 200 in a mold material 400 configured in accordance with embodiments of the present technology. The mold material 400 can be a resin, epoxy resin, silicone-based material, polyimide, or any other material suitable for encapsulating the die stacks 202a-c and/or at least a portion of the substrate 208 to protect these components from contaminants and/or physical damage. The mold material 400 can be positioned over each of the die stacks 202a-c and at least a portion of the substrate 208. The mold material 400 can surround the lateral surfaces of the die stacks 202a-c and fill the spaces between the die stacks 202a-c. The mold material 400 can also fill the channels 220.

Figure 5:
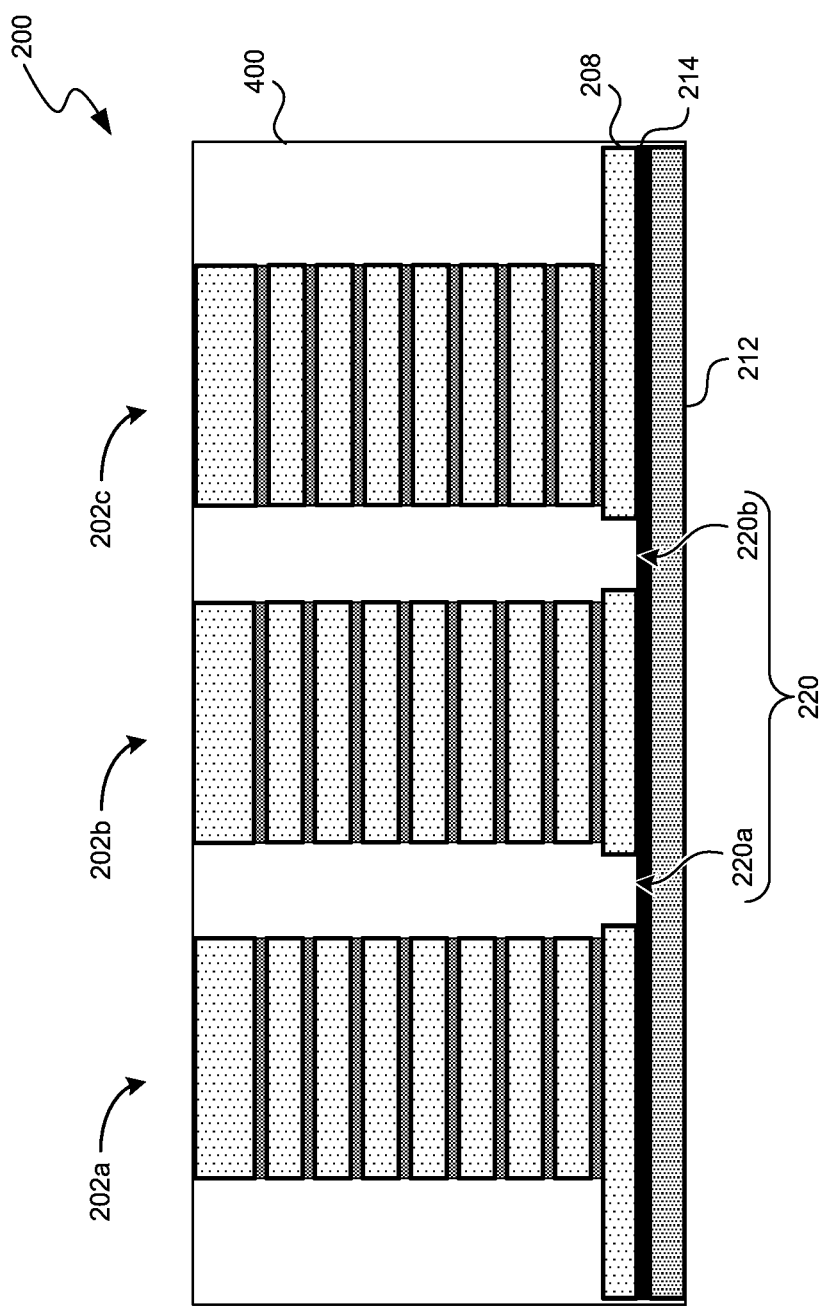
FIG. 5 illustrates thinning of the assembly of FIG. 4 in accordance with embodiments of the present technology.

FIG. 5 illustrates the assembly 200 after thinning in accordance with embodiments of the present technology. The thinning process can be performed after encapsulation of the assembly 200. The thinning process can reduce the thickness of the mold material 400 over the uppermost portions of the die stacks 202a-c, e.g., to expose the upper surfaces of the uppermost semiconductor dies in the die stacks 202a-c. Optionally, the thinning process can also reduce the thickness of the uppermost semiconductor dies in the die stacks 202a-c. Thinning can be performed according to various methods known to those of skill in the art, for example, coarse back grinding followed by fine grinding or polishing, wet (chemical) etching, dry plasma etching, or chemical mechanical planarization (CMP).

Figure 6:
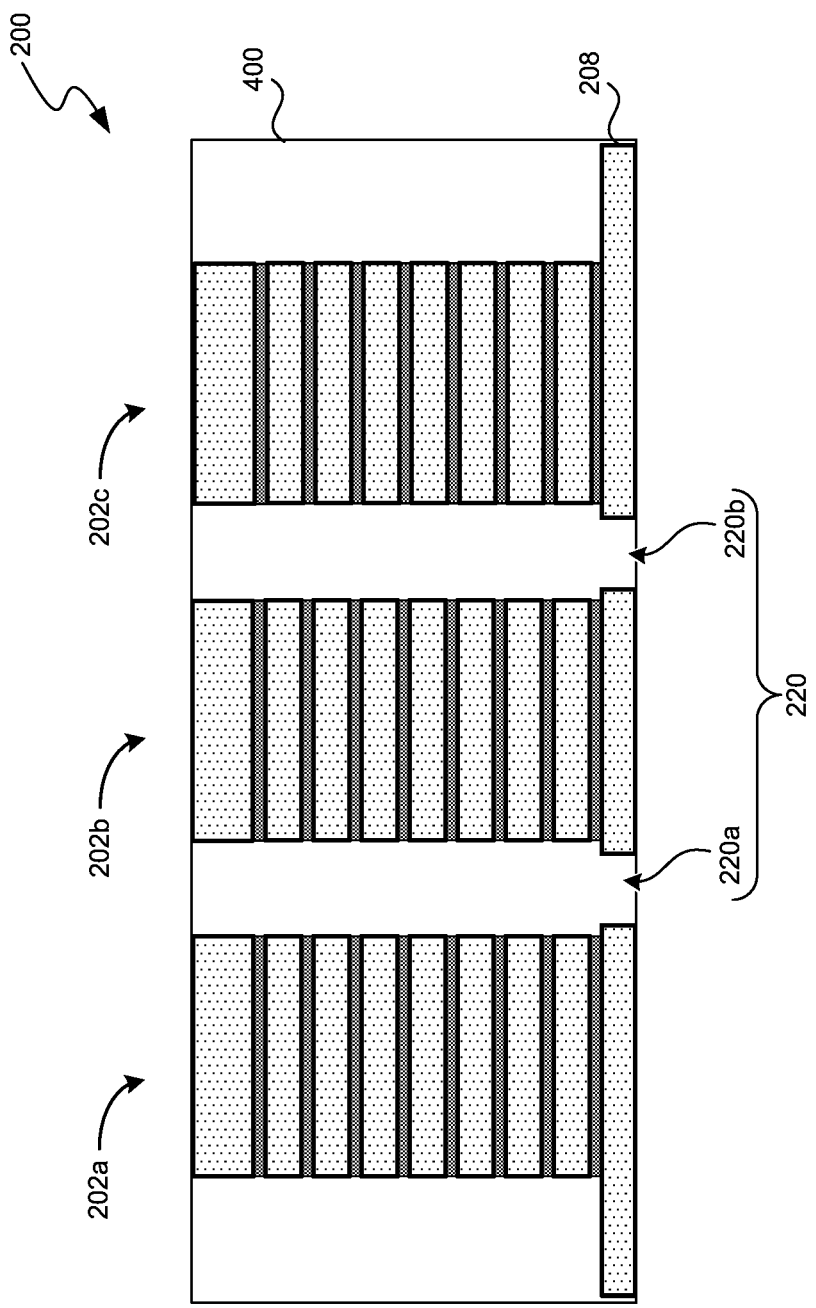
FIG. 6 illustrates separation of the assembly of FIG. 5 from a carrier in accordance with embodiments of the present technology.

FIG. 6 illustrates the assembly 200 after being separated from the carrier 212 in accordance with embodiments of the present technology. As previously described, the carrier 212 can be separated from the substrate 208 by applying a release stimulus (e.g., heat, light) or agent (e.g., a chemical agent) to the adhesive layer 214. In some embodiments, after separation, the assembly 200 includes the die stacks 202a-c, the substrate 208, and the mold material 400. Optionally, the assembly 200 can be coupled to a second carrier (not shown) before or after separation from the carrier 212 to provide mechanical support to the assembly 200 for subsequent processing. For example, the upper surfaces of the die stacks 202a-c and/or the mold material 400 can be coupled to a second carrier, and then electrically conductive elements (e.g., conductive bumps, balls, pillars, etc.) can be mechanically and/or electrically coupled to the lower surface of the substrate 208 to allow for subsequent attachment to higher-level components (e.g., a printed circuit board (PCB)).

After separation from the carrier 212, the assembly 200 can be separated (e.g., singulated) into a plurality of individual semiconductor packages. Singulation can be performed by cutting or dicing through the assembly 200 (e.g., using a blade) between the die stacks 202a-c to separate them into discrete packages. For example, the singulation process can involve cutting through the mold material 400 and/or portions of the substrate 208 between the die stacks 202a-c. The cuts made during the singulation process can be aligned and/or overlap with the channels 220 in the substrate 208. If the dicing blade is narrower than the width of the channels 220, the blade can pass through the channels 220 without cutting into the substrate 208. Alternatively, if the dicing blade is wider than the width of the channels 220, the blade can cut through portions of the substrate 208 surrounding the channels. In embodiments where the assembly 200 includes intermediate-depth channels that do not extend entirely through the substrate 208, the singulation process can involve cutting through the remaining thickness of the substrate 208 to separate the substrate 208 into discrete sections.

Figure 7A:
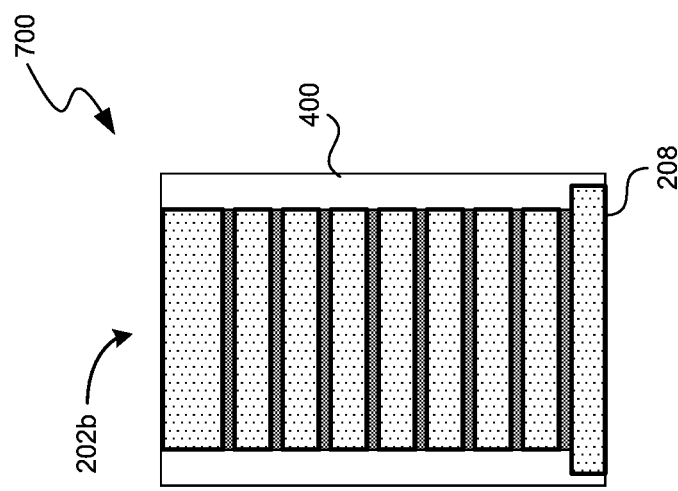
FIGS. 7A-7C illustrate singulated semiconductor packages configured in accordance with embodiments of the present technology.

FIG. 7A illustrates a singulated semiconductor package 700 configured in accordance with embodiments of the present technology. The package 700 can include a single die stack (e.g., second die stack 202b) mounted on a segment of the substrate 208 and surrounded by the mold material 400. In the illustrated embodiment, because the dicing blade width was smaller than the width of the channels formed in the substrate 208, the package 700 still includes mold material 400 surrounding the lateral outer portions of the substrate 208.

Figure 7B:
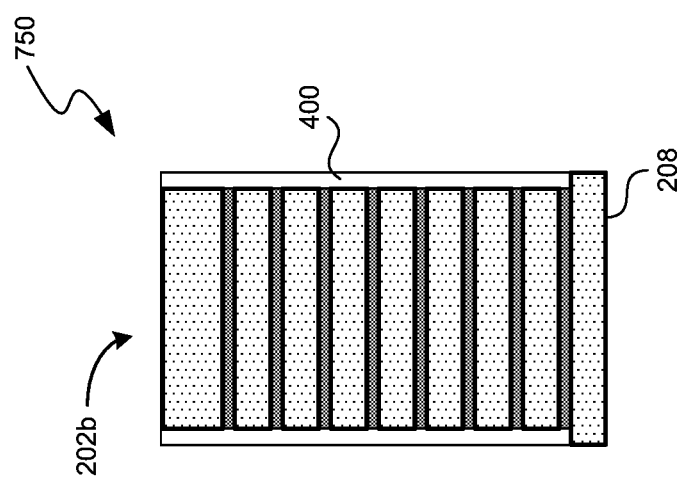

FIG. 7B illustrates a singulated semiconductor package 750 configured in accordance with embodiments of the present technology. Similar to the package 700 of FIG. 7A, the package 750 includes a single die stack (e.g., second die stack 202b) mounted on a segment of the substrate 208 and surrounded by the mold material 400. In the illustrated embodiment, because the dicing blade width was larger than the width W of the channels formed in the substrate 208 but smaller than the distance d between die stacks (e.g., as previously shown in FIG. 2B), the package 750 does not include any mold material 400 surrounding the lateral outer portions of the substrate 208, but does include mold material 400 surrounding the lateral outer portions of the die stack 202b.

Figure 7C:
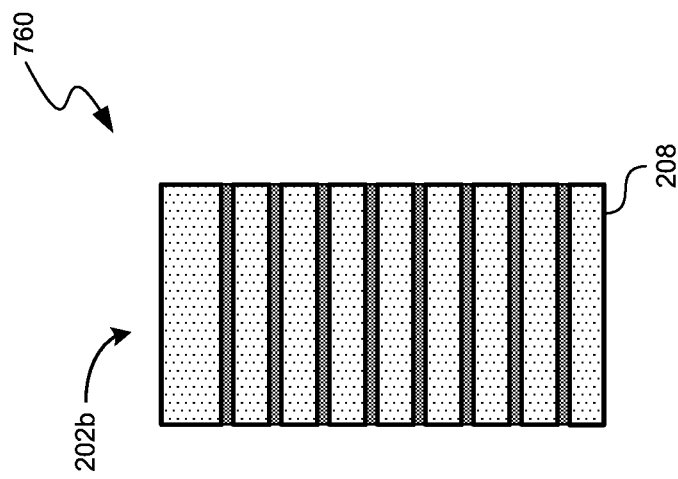

FIG. 7C illustrates a singulated semiconductor package 760 configured in accordance with embodiments of the present technology. Similar to the embodiments of FIGS. 7A and 7B, the package 760 includes a single die stack (e.g., second die stack 202b) mounted on a segment of the substrate 208. In the illustrated embodiment, because the dicing blade width was greater than or equal to the distance d between die stacks (e.g., as previously shown in FIG. 2B), the package 760 does not include any mold material 400 surrounding the lateral outer portions of the substrate 208 or the die stack 202b.

Figure 8:
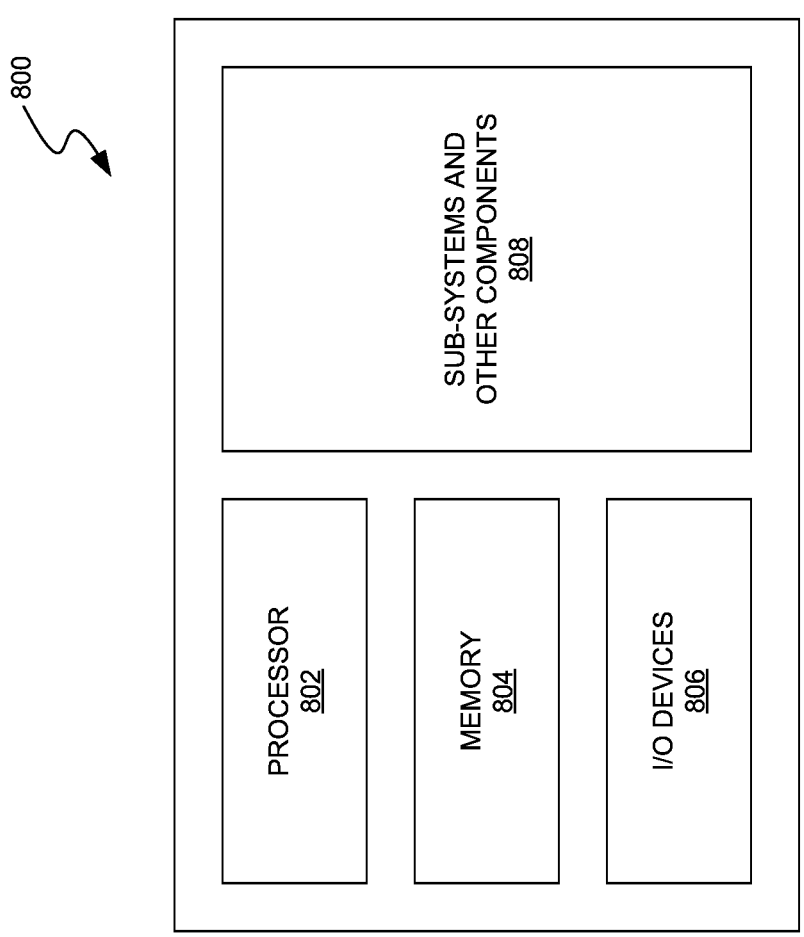
FIG. 8 is a schematic view of a system that includes a semiconductor device or package configured in accordance with embodiments of the present technology.

Any one of the semiconductor devices and/or packages having the features described above with reference to FIGS. 2A-7C can be incorporated into any of a myriad of larger and/or more complex systems, a representative example of which is system 800 shown schematically in FIG. 8. The system 800 can include a processor 802, a memory 804 (e.g., SRAM, DRAM, flash, and/or other memory devices), input/output devices 806, and/or other subsystems or components 808. The semiconductor dies and/or packages described above with reference to FIGS. 2A-7C can be included in any of the elements shown in FIG. 8. The resulting system 800 can be configured to perform any of a wide variety of suitable computing, processing, storage, sensing, imaging, and/or other functions. Accordingly, representative examples of the system 800 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 800 include lights, cameras, vehicles, etc. With regard to these and other example, the system 800 can be housed in a single unit or distributed over multiple interconnected units, e.g., through a communication network. The components of the system 800 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the method comprising:
   forming a channel in a region of a substrate between a first die stack having a plurality of first dies and a second die stack having a plurality of second dies before thermally bonding the first dies together using a thermocompression bonding process, wherein the first dies are attached to each other by first film layers and the second dies are attached to each other by second film layers, and wherein the channel extends entirely through a thickness of the substrate; and applying heat to the first die stack to cure the first film layers, wherein the channel reduces heat transfer from the first die stack to the second die stack.

2. The method of claim 1 wherein the substrate comprises a wafer or a package substrate.

3. The method of claim 1 wherein the channel is formed by cutting the region of the substrate with a blade or a laser.

4. The method of claim 1 wherein the channel extends at least partially into an adhesive layer coupled to a lower surface of the substrate.

5. The method of claim 1 wherein the channel is formed on an active surface of the substrate.

6. The method of claim 1 wherein the first die stack includes a plurality of first interconnect structures between at least some of the first dies, and the second die stack includes a plurality of second interconnect structures between at least some of the second dies.

7. The method of claim 6 wherein applying heat to the first die stack comprises:

curing the first film layers; and electrically coupling at least some of the first dies to each other via the first interconnect structures.

8. The method of claim 7 wherein none of the second film layers of the second die stack are cured by the heat applied to the first die stack.

9. The method of claim 7, further comprising applying heat to the second die stack after applying the heat to the first die stack, wherein applying heat to the second die stack comprises:

curing the second film layers; and electrically coupling at least some of the second dies to each other via the second interconnect structures.

10. The method of claim 1, further comprising:

encapsulating the first and second die stacks in a mold material;

thinning at least a portion of the mold material; and separating the first and second die stacks from each other.

11. A semiconductor assembly, comprising:

a substrate comprising an upper surface and a lower surface;

a first die stack coupled to the upper surface of the substrate, wherein the first die stack has a plurality of first dies attached to each other by first film layers;

a second die stack coupled to the upper surface of the substrate and spaced apart from the first die stack, wherein the second die stack has a plurality of second dies attached to each other by second film layers; and a channel in the upper surface of the substrate between the first and second die stacks, wherein the channel has a depth greater than or equal to a thickness of the substrate to inhibit heat transfer from the first die stack to the second die stack during a subsequent thermocompression bonding process applied to the first die stack.

12. The semiconductor assembly of claim 11 wherein a width of the channel is less than a distance between the first and second die stacks.

13. The semiconductor assembly of claim 11 wherein the first die stack includes a plurality of first interconnect structures configured to electrically couple at least some of the first dies, and the second die stack includes a plurality of second interconnect structures configured to electrically couple at least some of the second dies.

14. The semiconductor assembly of claim 11, further comprising a carrier coupled to the lower surface of the substrate.

15. The semiconductor assembly of claim 14, further comprising an adhesive layer between the carrier and the lower surface of the substrate.

16. The semiconductor assembly of claim 15 wherein the adhesive layer comprises an insulating material.

17. The semiconductor assembly of claim 15 wherein the channel extends through the substrate to the adhesive layer.

18. The semiconductor assembly of claim 11, further comprising a mold material over the first and second die stacks and within the channel.

19. A method of manufacturing a semiconductor device, the method comprising:

forming a channel in a region of a substrate between a first die stack having a plurality of first dies and a second die stack having a plurality of second dies before thermally bonding the first dies together using a thermocompression bonding process, wherein the first dies are attached to each other by first film layers and the second dies are attached to each other by second film layers, and wherein the channel extends at least partially through a thickness of the substrate; and applying heat to the first die stack to cure the first film layers, wherein the channel reduces heat transfer from the first die stack to the second die stack such that a second film layer between the substrate and a lowermost second die of the second die stack remains at least substantially uncured.

20. The method of claim 19 wherein the channel extends through at least 75% of the thickness of the substrate.

* * * * *